United States Patent [19]

Boyle et al.

[11] Patent Number: 4,746,256

[45] Date of Patent: May 24, 1988

[54] APPARATUS FOR HANDLING SENSITIVE MATERIAL SUCH AS SEMICONDUCTOR WAFERS

[75] Inventors: Edward F. Boyle; G. Scott Wilkins, both of Gig Harbor, Wash.

[73] Assignee: Roboptek, Inc., Gig Harbor, Wash.

[21] Appl. No.: 839,790

[22] Filed: Mar. 13, 1986

[51] Int. Cl.$^4$ .......................... B65G 65/34; B65H 5/08
[52] U.S. Cl. .................................... 414/217; 414/225; 414/331
[58] Field of Search ................. 414/217, 331, 222, 225

[56] References Cited

U.S. PATENT DOCUMENTS

| | | | |
|---|---|---|---|
| 4,501,527 | 2/1985 | Jacoby et al. | 414/225 |
| 4,502,830 | 3/1985 | Inaba et al. | 901/17 X |
| 4,550,242 | 10/1985 | Uehara et al. | 414/331 X |
| 4,553,069 | 11/1985 | Purser | 414/222 X |
| 4,616,683 | 10/1986 | Tullis et al. | 414/217 X |
| 4,674,936 | 6/1987 | Bonora | 414/217 |
| 4,674,939 | 6/1987 | Maney et al. | 414/217 X |

OTHER PUBLICATIONS

Mihir Parikh and Ulrich Kaempf, "SMIF: A Technology for Wafer Cassette Transfer in VLSI Manufacturing", brochure from Hewlett Packard Laboratories, Palo Alto, CA.

Brochure entitled "SMIF Technology Reduces Clean Room Requirements" from Asyst Technologies, May 1985.

Information brochure on LEITZ MPV CD 2 from Ernst Leitz Wetzlar GmbH.

Information brochure on Leitz Ergolux from Ernst Leitz Wetzlar GmbH.

Five information pages from Asyst Technologies, Inc., regarding various SMIF products.

Primary Examiner—Robert J. Spar
Assistant Examiner—Stuart J. Millman
Attorney, Agent, or Firm—Christensen, O'Connor, Johnson & Kindness

[57] ABSTRACT

An apparatus for handling or inspecting a sensitive material such as a semiconductor wafer or mask in a self-contained environment, such that the apparatus can be used outside a clean room. The apparatus incorporates a standardized mechanical interface for transferring the wafers or other sensitive material to and from the apparatus in a box having a cover, a bottom, a latch assembly releasably connecting and sealing the cover to the bottom, and a carrier such as a cassette for supporting the wafers. The apparatus includes a base and a canopy attached to the base so as to create an enclosed space between the base and canopy. The canopy includes a port door releasably secured to the canopy, the port door including an upper surface adapted for supporting the bottom of the box. The apparatus also includes a manipulator and electronic control for controlling the manipulator. The manipulator is operable when the box has been positioned on the port door for moving the cassette out of the cover, and is operable when the cassette has been moved out of the cover for transferring wafers between the cassette to a working area, such as the viewing stage of a microscope assembly, within the enclosed space. A novel latch actuator is provided, the latch actuator being operable when the box is positioned on the port door for releasing the port door from the canopy, releasing the bottom from the cover, and securing the cover to the canopy. The manipulator includes a robot assembly having a tip for engaging the semiconductor material, and an elevator for moving the robot assembly along a vertical Z axis. The robot assembly also functions to support the port door, box bottom and cassette to lower such components out of the cover.

15 Claims, 12 Drawing Sheets

APPARATUS FOR HANDLING SENSITIVE MATERIAL SUCH AS SEMICONDUCTOR WAFERS

FIELD OF THE INVENTION

The present invention relates to an apparatus for the handling sensitive material using a standardized mechanical interface mechanism. The apparatus is especially suited to the handling of semiconductor wafers and masks in a self-contained clean environment.

BACKGROUND OF THE INVENTION

The steps involved in the manufacture of an integrated circuit include the slicing of a semiconductor crystal into thin wafers, polishing of the wafers, preparation of masks or reticles, oxidation of the wafers, doping of the semiconductor material comprising the wafers, and processing the wafers through circuit forming steps such as photolithography, etching, exposure, etc. Once the circuits have been formed on a wafer, the individual circuits are probed to confirm that they are functional, and the wafer is then cut into chips and the individual chips packaged. At any one of these steps in the manufacturing process, it may be required to visually inspect the wafers for imperfections. In the past, the manufacturing steps, including the inspections, have typically been carried out in a clean room from which dust and other airborne particles have been substantially excluded.

Recently a system has been designed to permit the handling of semiconductor wafers both inside and outside of clean rooms. The system incorporates a standardized mechanical interface, and is commonly referred to by the acronym SMIF. The SMIF system includes dust-proof boxes for the transport and storage of the wafers. Referring to FIG. 1, such a box 10 is shown comprising cover 12, box door 14, and cassette or carrier 16 within the box and supported by the box door. Cover 12 is secured to box door 14 by a latch system indicated generally by reference numerals 18. Cassette 16 comprises a plurality of shelves arranged vertically one above the other, each shelf being adapted to hold one wafer or mask.

In the SMIF system, an arbitrary processing device 20 has a cassette port 22 through which cassettes can enter and leave the device. Canopy 24 is connected to device 20 overlying the cassette port, and provides an enclosed, clean environment surrounding the cassette port. Incorporated into canopy 24 is port door 26 that is constructed to support and preferably mate with box door 14. Referring to FIG. 2, box 10 can be placed on port door 26, and the latch system is then actuated, the latch system being operative to release box door 26 from cover 12, and to connect the cover to the canopy. Port door 26 is then released from canopy 24, and the port door, box door and cassette may then be lowered into the space enclosed by canopy 24 by a suitable elevator 30. Once the cassette is within the canopy, it can be manipulated by arm 28 to move the cassette-to-cassette port 22, or for other operations.

SUMMARY OF THE INVENTION

The present invention is directed to a novel implementation of the interface system described above and shown in FIGS. 1 and 2. This implementation significantly enhances the SMIF concept by providing wafer manipulation means within the canopy that can handle individual wafers and mask and that can also move cassettes into and out of the boxes, an improved latching mechanism, and an integrated, stand alone wafer inspection station.

In a preferred embodiment, the present invention provides an apparatus for handling a sensitive material such as a semiconductor wafer or mask in a self-contained environment. The sensitive material is stored in a box having a cover, a bottom, and means for releasably connecting and sealing the cover to the bottom. The box also includes a carrier or cassette for supporting the sensitive material. The box may therefore be used for transporting and storing the sensitive material in a clean environment. The apparatus of the present invention comprises a base, a canopy attached to the base so as to create an enclosed space therebetween, the canopy including a port door releasably secured to the canopy. The port door includes an upper surface adapted for supporting the bottom of the box. The apparatus further comprises manipulator means operable when the box has been positioned on the port door for moving the carrier out of the cover, and operable when the carrier has been moved out of the cover for transferring the sensitive material between the carrier and a working area within the enclosed space. The apparatus also includes electronic control means for controlling the manipulator means.

In an embodiment of the apparatus adapted for the inspection of the sensitive material, the apparatus further includes a microscope assembly having a viewing stage positioned within the enclosed space. The manipulator means is operable for transferring the sensitive material out of the carrier to the viewing stage, at which point the microscope assembly can be remotely operated by means of the electronic control means.

In a further aspect, the apparatus of the present invention further comprises a latch actuator secured to the canopy and movable between first and second positions. The latch actuator in its first position is operative to secure the port door to the canopy. Movement of the latch actuator from its first position to its second position, when the box has been positioned on the port door, releases the port door from the canopy, releases the bottom from the cover, and secures the cover to the canopy. The manipulator means preferably comprises a tip adapted for engaging the sensitive material and the port door, and means for moving the tip. The means for moving the tip is operative, when the bottom and port door have been released from the cover and canopy respectively, to cause the tip to support and lower the port door, bottom and carrier, such that the carrier is moved out of the cover. When the carrier has been moved out of the cover, the sensitive material can be engaged by the tip and moved between the carrier and the working area or viewing stage. The manipulator means may comprise a support, means for moving the support upward and downward along a vertical Z axis, and a robot assembly mounted by the support. The robot assembly includes the tip, as well as means for retracting and extending the tip along a radial direction, respectively toward and away from the Z axis, and means for rotating the tip in a circular direction about the Z axis, such that the tip when extended can be positioned under the port door to support and lower the port door. The apparatus may also comprise a second port door, also releasably secured to the canopy, such that sensitive material can be transferred between two boxes.

DETAILED DESCRIPTION OF THE INVENTION

Figure 1:
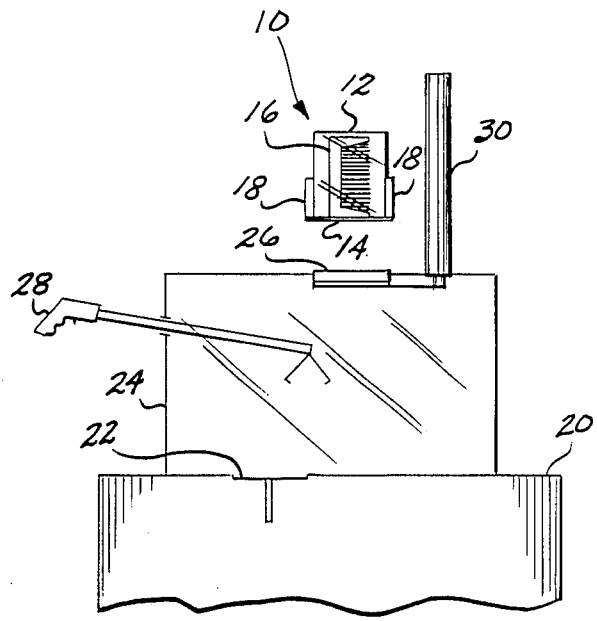
FIG. 1 is a schematic view of a prior art system that includes a standardized mechanical interface for handling of wafer storage cassettes outside of clean rooms.
Figure 2:
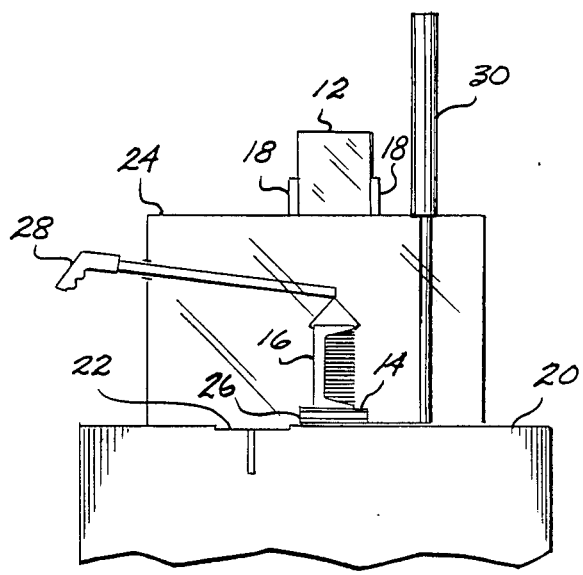
FIG. 2 is a second view of the system of FIG. 1 showing a cassette lowered into the space enclosed by a canopy.
Figure 3:
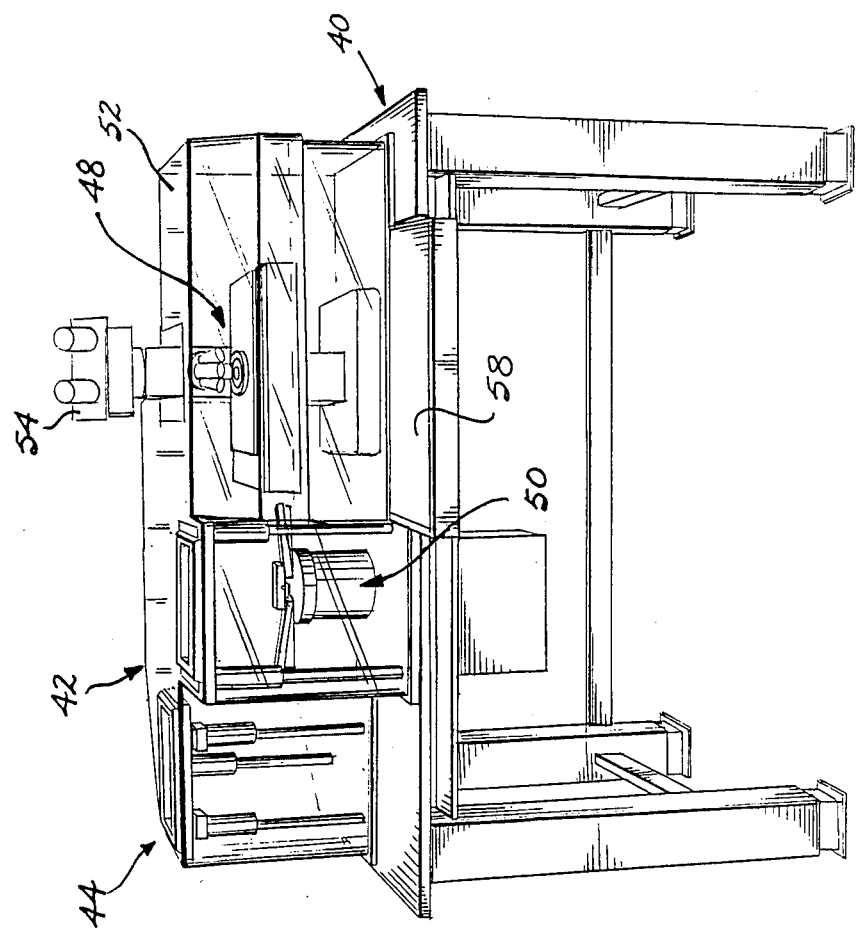
FIG. 3 is a front perspective view of a preferred embodiment of the wafer handling apparatus of the present invention.
Figure 4:
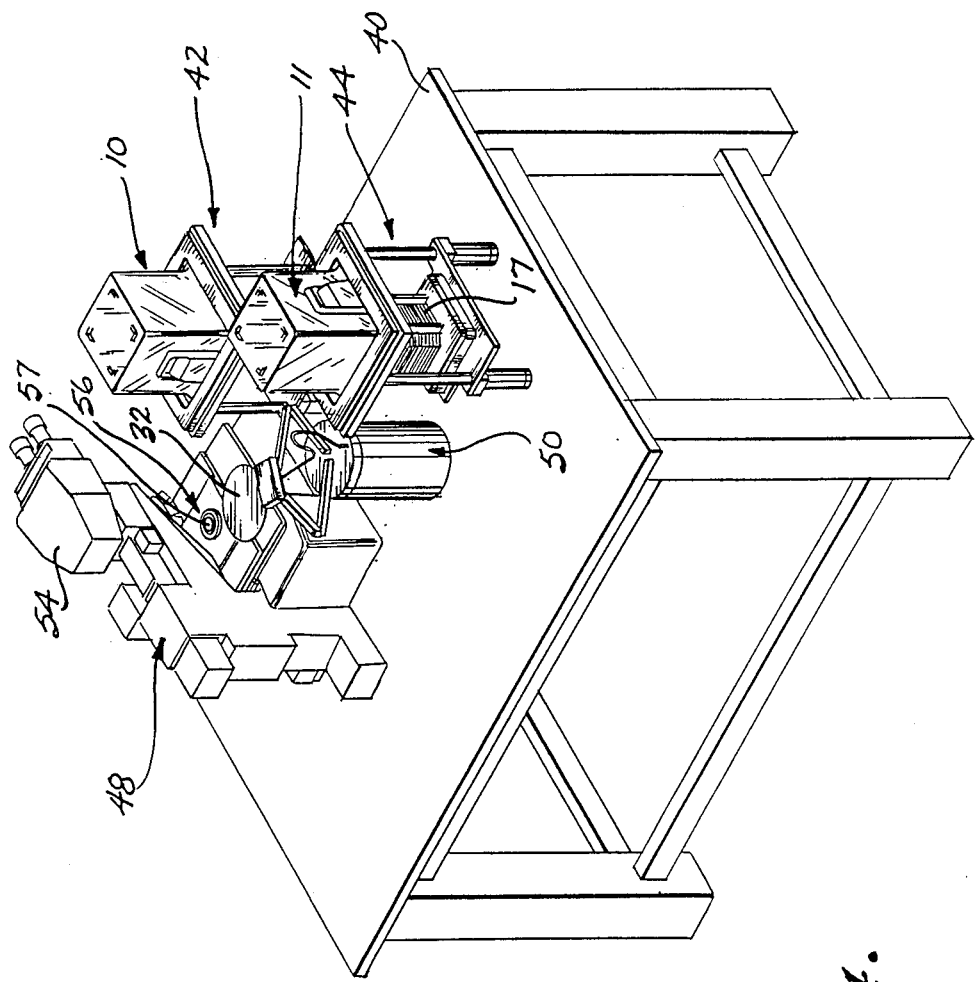
FIG. 4 is a left rear perspective view of the apparatus of FIG. 3 with the canopy removed.
Figure 5:
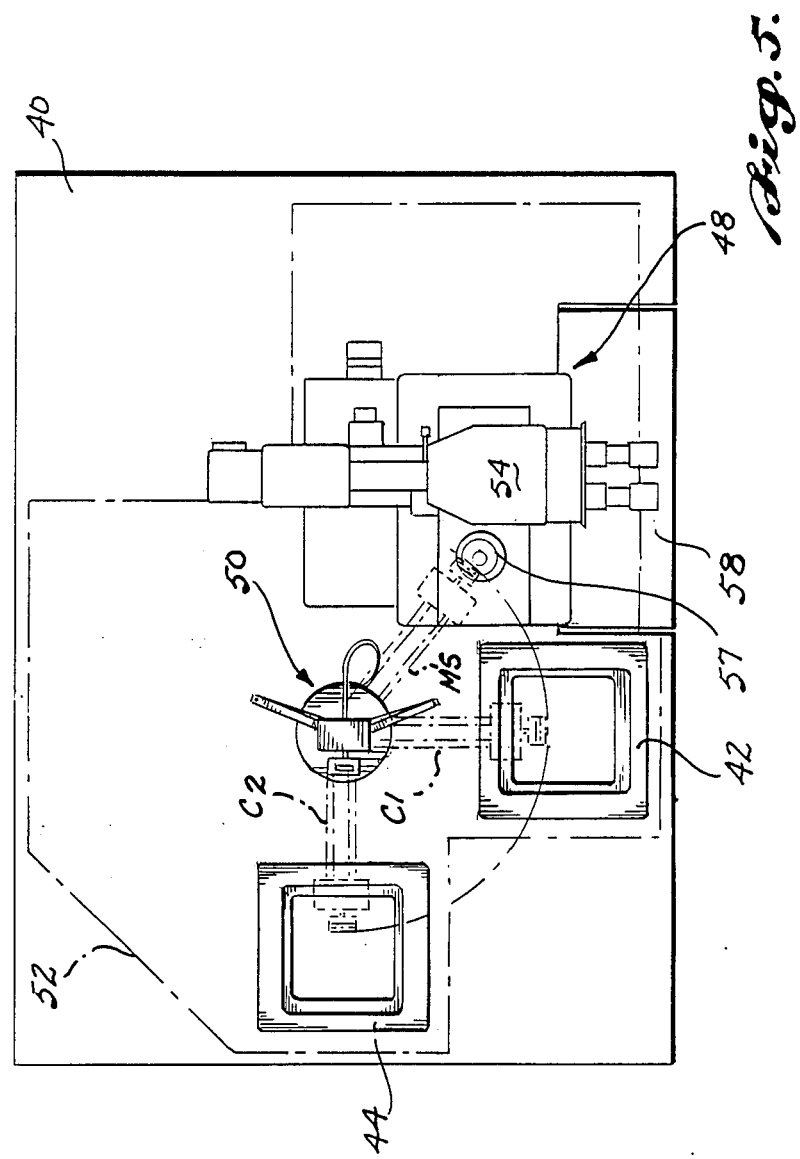
FIG. 5 is a top plan view of the apparatus of FIG. 3.

The principles of the present invention are illustrated, by way of example, by the inspection apparatus shown in FIGS. 3-5. Although the apparatus will be described herein with relationship to semiconductor wafers, it is to be understood that the apparatus is suitable for the inspection or handling of any sensitive material that should be kept separated from the surrounding environment. By way of example, other sensitive material for which the apparatus of the present invention may be used includes other dust or contamination sensitive materials, such as semiconductor masks, or materials from which the environment should be protected such as materials containing bacterial or viral agents, radioactive materials, or the like.

The apparatus shown in FIGS. 3-5 is mounted on table 40 that may have any suitable size, shape and construction. Mounted by table 40 are first and second port assemblies 42 and 44 respectively, microscope assembly 48, and robot assembly 50. Canopy 52 is secured to table 40, and encloses all of the above-mentioned components except for the upper stage 54 of the microscope assembly. A suitable microscope assembly is the Ergolux inspection and measuring microscope available from Leitz. Such a microscope includes a motor driven turret containing five different objectives, and a viewing stage 56 that may be translated in X and Y horizontal directions. For increased convenience, the microscope assembly may be provided with a rotatable chuck 57 on stage 56. Chuck 57 may be connected to a vacuum source such that material positioned on the chuck can be securely held in position while the stage is translated horizontally. Other features of the microscope assembly will be described below. The apparatus shown in FIGS. 3-5 also includes control panel 58 that may be used for controlling operation of the apparatus.

Although FIGS. 3-5 illustrate an apparatus for inspecting semiconductors, wafers and the like, it will readily be appreciated by those skilled in the art that the principles of the present invention apply equally to the transport of wafers to and from other wafer handling or processing equipment such as ion implanters, oxidation furnaces and the like. In such an application, microscope assembly 48 would be replaced by the appropriate equipment.

In FIG. 4, the canopy has been removed to more clearly show the underlying components. However, it is to be understood that canopy 52 will be present during operation of the wafer inspection apparatus. A clean environment may be maintained within canopy 52 by providing a small HEPA filter and blower (not shown) to provide positive air pressure inside the canopy. FIG. 4 illustrates boxes 10 and 11 positioned at the first and second port assemblies respectively, and semiconductor wafer 32 being positioned by robot assembly 50 on stage 56 of microscope assembly 48.

Figure 6:
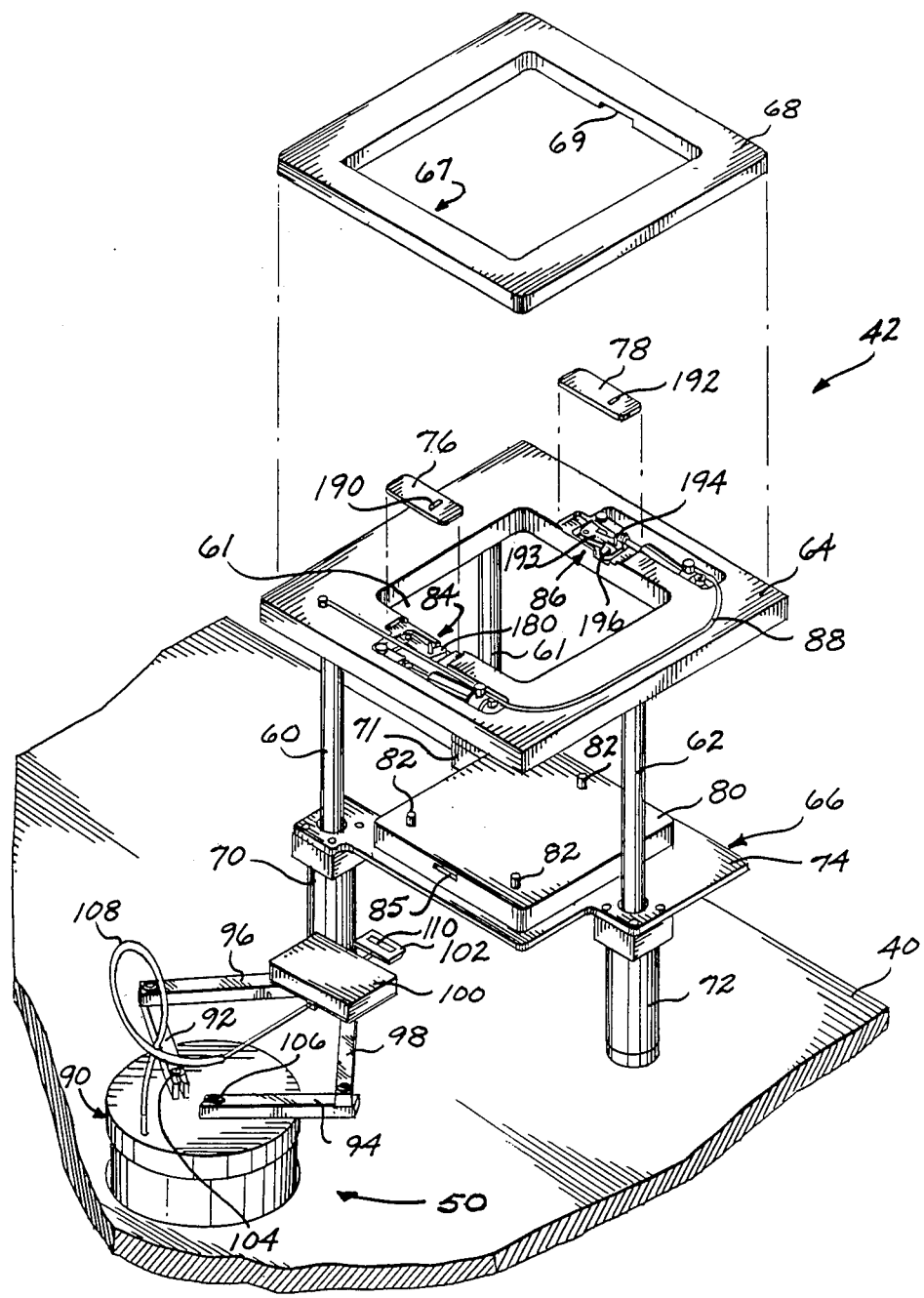
FIG. 6 is an exploded perspective view of a port assembly.
Figure 9:
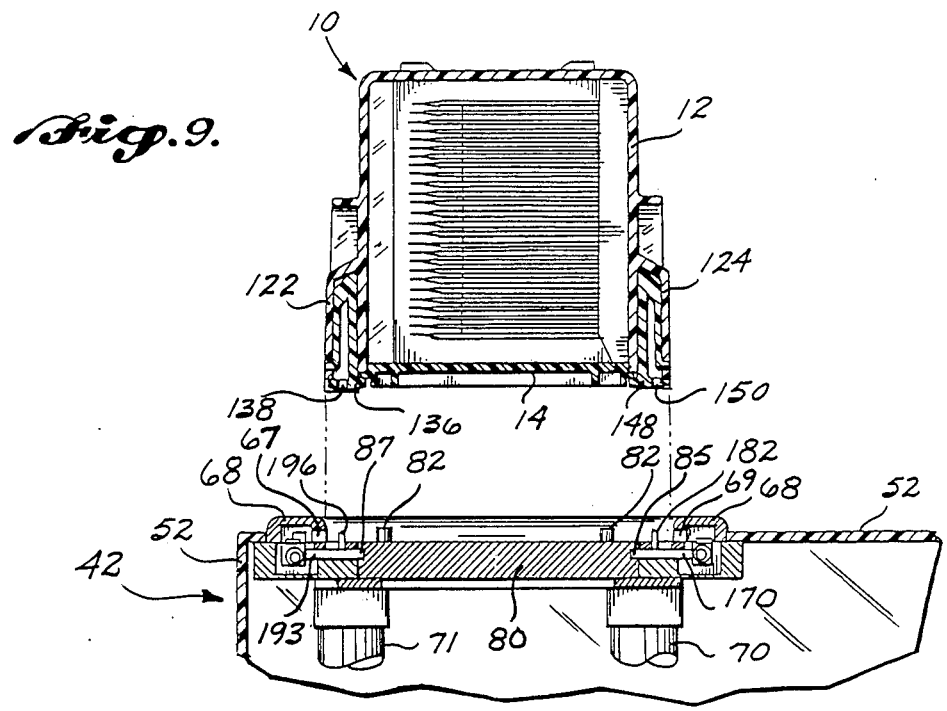
FIG. 9 is a cross-sectional view showing the lowering of a box onto a port assembly.

Referring now to FIG. 6, first port assembly 42 comprises rods 60, 61 and 62 secured to and extending upward from table 40, port plate 64 supported by rods 60-62, elevator assembly 66 and cover 68. Elevator assembly 66 includes sleeve assemblies 70, 71 and 72, plate 74 secured to the sleeve assemblies, and port door 80 supported by plate 74. Registration pins 82 are formed in the upper surface of port door 80. The entire elevator assembly 66 can slide upward or downward along rods 60-62, as further described below. Embedded within port plate 64 are latch actuators 84 and 86. The latch actuators are operated by pneumatic pressure supplied through conduit 88. The side of port door 80 facing robot mechanism 50 includes slot 85, and the opposite side of port door 80 includes a similar slot 87 (FIG. 9). Port door 80 can be latched to port plate 64 by engagement between latch actuators 84 and 86 and slots 85 and 87, respectively. Cover 68 is bolted to port plate 64 by suitable means (not shown), and the underside of cover 68 includes slots 67 and 69 (slot 67 shown in FIG. 10), the purpose of these slots being explained below. The second port assembly 44 is preferably identical to first port assembly 42.

Robot assembly 50 comprises base assembly 90, first arms 92 and 94, second arms 96 and 98, and a tip comprising box 100 and wafer support 102. One end of first arm 92 is connected to shaft 104 that extends from the upper surface of base assembly 90, and one end of first arm 94 is connected to a similar shaft 106. The opposite ends of first arms 92 and 94 are pivotally connected to second arms 96 and 98 respectively, the opposite ends of the second arms being connected to box 100 that includes an antibacklash mechanism. Wafer support 102 extends outward from the lower surface of box 100, and includes a flat upper surface having opening 110 formed therein, the opening passing between the upper surface of the wafer support and a plenum chamber within the wafer support. The plenum chamber is connected to a suitable vacuum source by flexible line 108.

Robot assembly 50 is capable of executing three distinct types of movement. Base assembly 90 can be moved upward or downward with respect to table 40, thereby moving the entire robot assembly in the vertical (Z axis) direction. Robot assembly 50 can also be rotated about the central, vertical axis of the base assembly to thereby rotate the entire robot assembly in a plane parallel to the top of table 40. Finally, shafts 104 and 106 can be rotated by equal amounts in opposite directions, to thereby move the tip comprising box 100 and wafer support 102 toward and away from the base assembly, between an extended position and a retracted position. FIG. 5 shows the robot assembly in a fully retracted position in solid lines, and in three fully extended positions in phantom lines. FIGS. 4 and 6 show the robot assembly in a partially extended position. As a result of the range of movement of the robot assembly, the robot assembly can perform two distinct operations. First, the robot assembly can be extended such that box 100 underlies a port door, and the robot assembly can be raised and lowered so as to raise and lower the port door, including a box door and cassette position thereon. Second, once a cassette has been lowered out of a box cover, the robot assembly can move individual wafers between two cassettes or between a cassette and the viewing stage of the microscope assembly.

Figure 7:
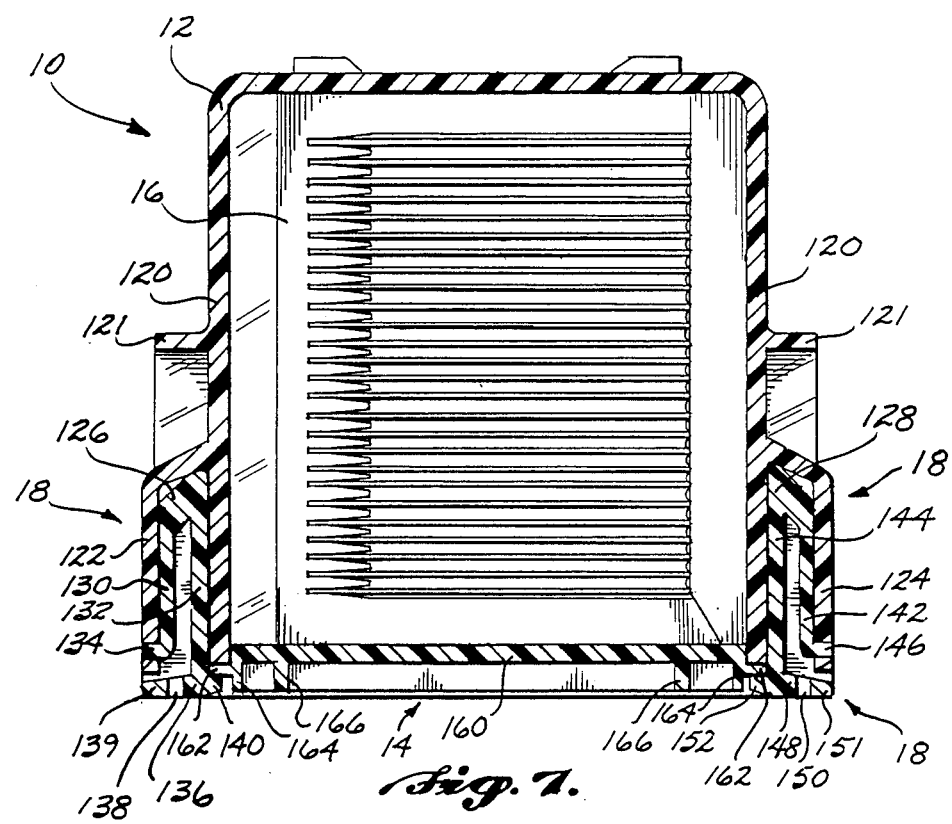
FIG. 7 is a cross-sectional view of a box containing a wafer storage cassette.

Referring now to FIG. 7, box 10 (previously described in connection with FIG. 4) includes cover 12, box door 14, cassette 16 resting on box door 14, and latch system 18. Cover 12 includes sidewall 120, handles 121 for manually lifting the box, and skirts 122 and 124 extending outward from the sidewall at two opposite positions around the circumference of the box (see also FIG. 4). The skirts extend downward to a position slighly beneath the lower edge of sidewall 120. Each of skirts 122 and 124 forms a cavity open at its bottom within which inserts 126 and 128 respectively are positioned. Insert 126 comprises an inverted U-shaped body having outer leg 130 and inner leg 132. The lower end of outer leg 130 includes tab 134 that extends through a corresponding slot near the lower end of skirt 122 and secures the insert in the cavity formed between the skirt and sidewall. The lower end of inner leg 132 comprises foot 136 that includes vertically extending opening 138, outwardly extending toe 139, and inwardly extending heel 140. In a similar manner, insert 128 comprises outer leg 142, inner leg 144, tab 146, and foot 148, the foot including opening 150, toe 151 and heel 152.

Box door 14 includes floor 160 having shoulder 162 extending outwardly around the circumference of the floor. The box door also includes downwardly projecting legs 164 and 166 extending circumferentially beneath the floor. When box 10 is assembled, as shown in FIG. 7, shoulder 162 is positioned between the lower edges of sidewall 120 and heels 140 and 152 of feet 136 and 148, respectively. In this configuration, the box door is firmly secured to cover 12 to provide a clean and airtight container for the wafers stored in cassette 16.

Figure 8:
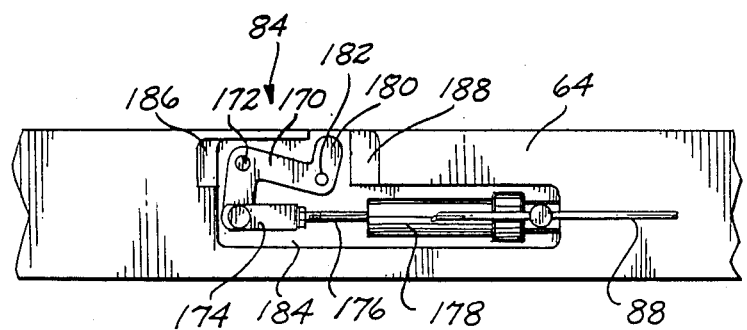
FIG. 8 is a partially cut-away view of a latch actuator.

Latch actuator 84 is shown in greater detail in FIG. 8. The latch actuator comprises a generally Z-shaped arm 170 that is mounted for pivotal movement about pivot pin 172. One end of arm 170 is connected to bracket 174 that is in turn secured to actuating rod 176 of pneumatic actuator 178. The opposite end of arm 170 includes rounded projection 180, and pin 182 extending upward from the arm. Arm 170 and actuator 178 are positioned in recess 184 formed in the upper surface of port plate 64. Referring to FIG. 6, cover plate 76 overlies a portion of arm 170, the ends of the cover plate being received in shallow recesses 186 and 188 in the upper surface of the port plate. Cover plate 76 includes slot 190 through which pin 182 extends. Latch actuator 86 is the mirror image of latch actuator 84, and includes arm 193, projection 196 and pin 194 that extends through slot 192 in cover plate 78. Both latch actuators are connected to the same source of pneumatic pressure through conduit 88.

Referring now to FIGS. 3 and 6–9, a typical sequence of operations for the wafer handling apparatus may now be described. At the commencement of operation, the apparatus would appear as generally indicated in FIG. 3, with first port assembly 42 and second port assembly 44 both in their raised positions. Referring in particular to first port assembly 42, port door 80 is positioned within the rectangular central opening of port plate 64. The port door is latched in this position within port plate 64 by means of latch actuators 84 and 86. Actuation rod 176 (FIG. 8) and the corresponding actuating rod for latch actuator 86 are in retracted positions, such that projections 180 and 196 extend into the central opening in port plate 64 and are received within slots 85 and 87 respectively in the lateral edges of the port door. Second port assembly 44 is in a similar configuration at this time. In this state, canopy 52 and the port assemblies form an enclosed space surrounding robot mechanism 50 and stage 56 of microscope assembly 48.

Figure 10:
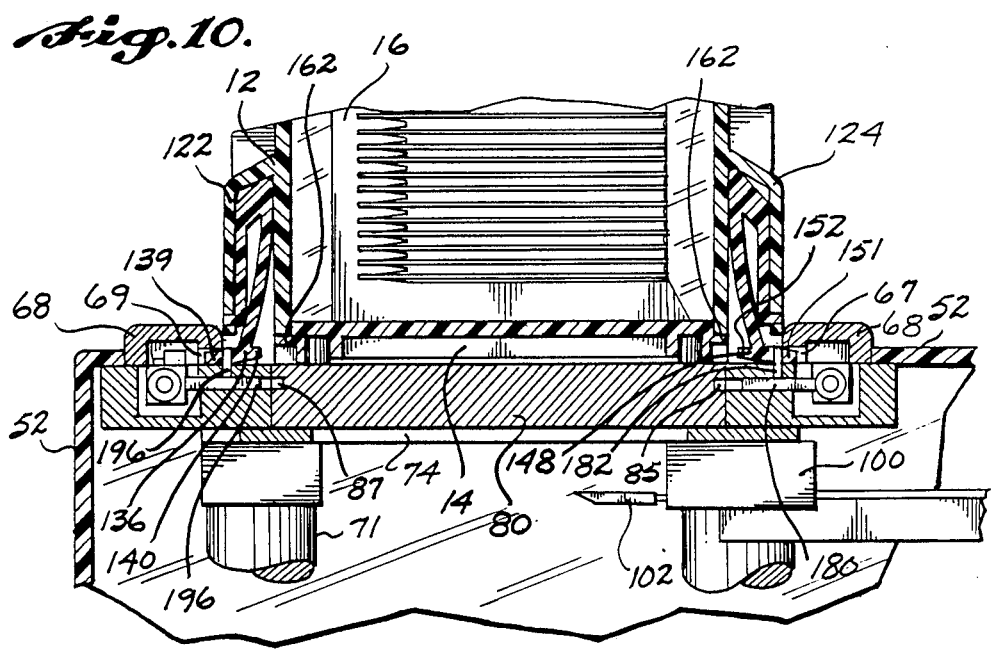
FIG. 10 is a cross-sectional view showing a box latched to a port assembly.
Figure 11:
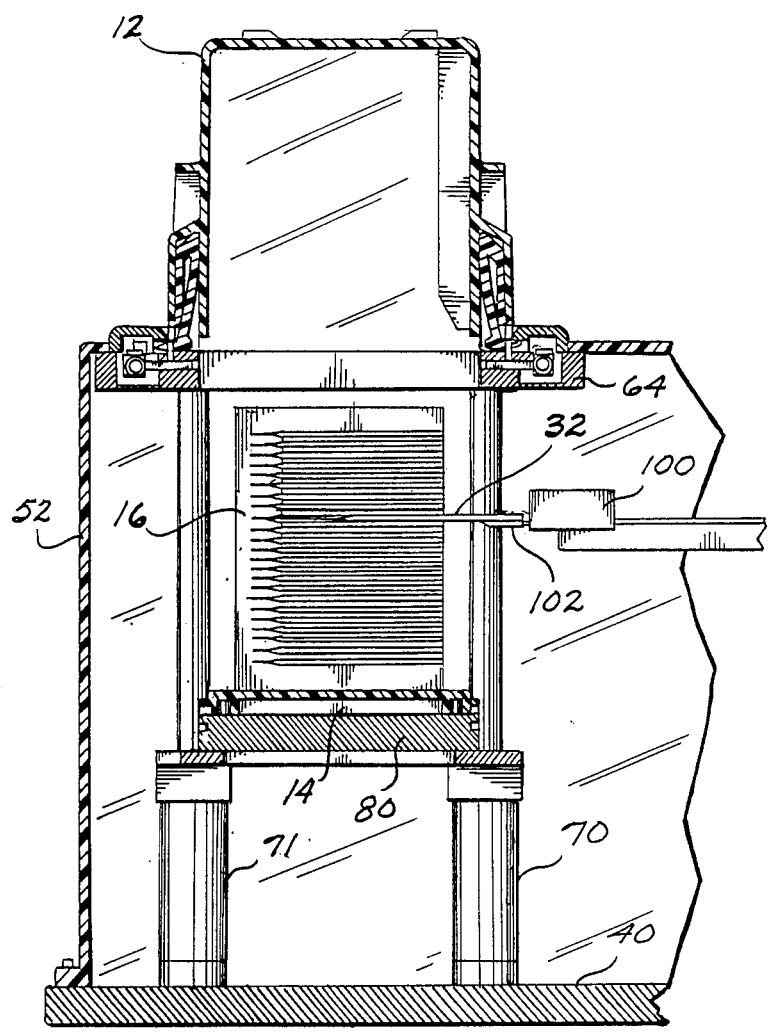
FIG. 11 is a cross-sectional view showing a cassette that has been lowered into the space enclosed by the canopy.

Referring now to FIGS. 9 and 10, when box 10 is lowered onto port door 80, the lower edges of skirts 122 and 124 fit within the space between opposite sides of cover 68, and box door 14 rests on port door 80, the positioning of the box door on the port door being aided by registration pins 82 on port door 80 and corresponding openings (not shown) in the lower surface of box door 14. In this position, pins 182 and 196 are received within openings 150 and 138 respectively in feet 148 and 136, respectively. Once the box has been lowered onto port assembly 42, robot assembly 50 is rotated such that it faces the port assembly, and is then extended as shown in the phantom lines labelled C1 in FIG. 5, such that box 100 of the robot assembly is positioned under the side of plate 74 closest to the robot mechanism. The robot mechanism is then raised to the position shown in FIG. 10 in which box 100 contacts the underside of plate 74. Latch actuators 84 and 86 are then operated such that projections 180 and 196 and pins 182 and 194 are moved away from one another to the positions shown in FIG. 10. This single movement of the latch arms performs three distinct functions. First, feet 136 and 148 are moved in an outward direction, thereby moving heels 140 and 152 out from under shoulder 162, thereby releasing box door 14 from cover 12. Second, movement of feet 136 and 148 outward move toes 139 and 151 respectively outward, such that the toes extend into slots 67 and 69 formed in the lower surface of cover 68, thereby securing cover 12 to the port plate and canopy. Third, movement of projections 180 and 196 outward withdraws the projections from slots 85 and 87 in port door 80, thereby releasing the port door from the port plate. The weight of port door 80, box door 14 and cassette 16 is then supported by box 100 and robot assembly 50. The robot mechanism can then be moved in a downward direction, thereby lowering the port door, box door and cassette, until the lower surfaces of sleeves 70–72 contact table 40. This position of the port door, box door and cassette is shown in FIG. 11.

Once the elevator assembly has been lowered onto table 40, the robot mechanism may be operated so as to remove individual wafers from cassette 16. In order to remove a wafer, such as wafer 32, the robot assembly is first rotated until it faces the appropriate port assembly, then raised or lowered to the appropriate vertical position, and finally the robot mechanism is extended such that wafer support 102 extends into cassette 14 to a position underlying wafer 32 to be removed. A vacuum is then applied to the wafer support 102, permitting wafer 32 to be supported by the wafer support. The robot mechanism is then retracted to withdraw wafer 32 from the cassette. Subsequent operation then depends upon the particular purpose for which wafer 32 was removed. By way of example, robot assembly 50 could be rotated to a position generally indicated in FIG. 4 wherein the robot assembly faces stage 56 of microscope assembly 48, and the robot mechanism can then be extended such that the wafer moves toward and places the wafer onto the chuck. The microscope stage can then be manipulated through the use of control panel 58, to permit an operator to inspect any position on the wafer surface. If the wafer is acceptable, the wafer inspection apparatus could then retrace the above steps to replace wafer 32 in cassette 16. If the wafer were unacceptable, essentially the same steps could be used to insert the wafer into a cassette introduced into the wafer handling apparatus via second port assembly 44. As will be appreciated from FIG. 5, the robot assembly, the first and second port assemblies, and the microscope stage are positioned such that each can be accessed by the robot mechanism when the robot mechanism is rotated to the appropriate orientation and then extended.

Figure 12:
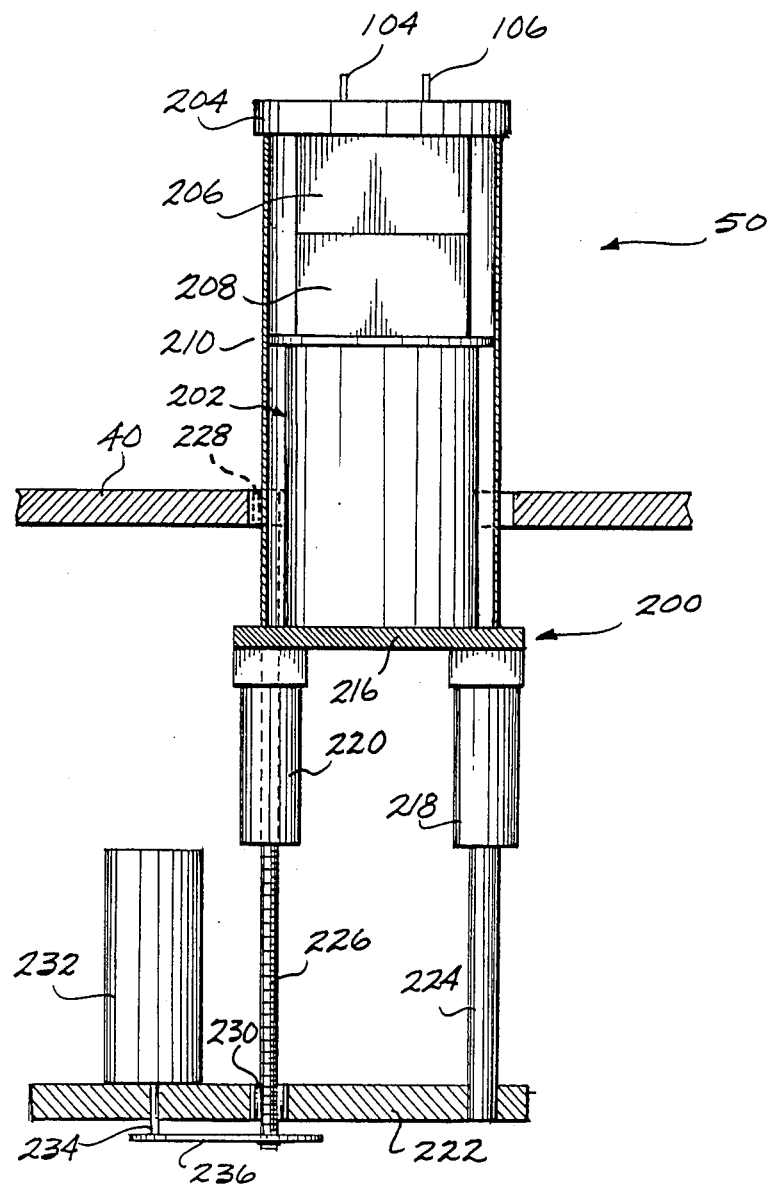
FIG. 12 is a cross-sectional view showing the robot mechanism.

The construction of robot assembly 50 is shown in greater detail in FIG. 12. The robot assembly includes elevator 200, pedestal 202 mounted on and supported by elevator 200, and base assembly 90 mounted on and supported by the pedestal. The base assembly comprises cap 204 from which posts 104 and 106 extend, post control assembly 206 and rotator 208. Rotator 208 is secured to upper plate 210 of pedestal 202, and is therefore stationary with respect to the pedestal. However in response to suitable electrical signals, rotator 208 can cause cap 204 and post control assembly 206 to rotate about the central vertical axis of the robot assembly, thereby causing the rotational movement schematically illustrated in FIG. 5. Post control assembly 206 controls the rotation of posts 104 and 106 in response to suitable electrical signals, to cause extension and retraction of arms 92, 94, 96 and 98 and box 100, as previously described. Robot assemblies including cap 204, post control assembly 206, rotator 208, arms 92, 94, 96 and 98 and box 100 are known and commercially available. These components may, for example, be implemented by means of the Compact Orbitran robot assembly available from Brooks Automation.

Elevator 200 comprises support plate 216, a plurality of sleeves 218 having smooth internal bores (only one sleeve 218 shown in FIG. 12), and sleeve 220 having a threaded internal bore. The elevator is supported by an assembly comprising lower plate 222, a plurality of posts 224 secured to and depending from table 40 (only one post 224 shown), and threaded shaft 226 that has its ends mounted in table 40 and lower plate 222 by bearings 228 and 230 respectively. Each post 224 is received in a sleeve 218, and threaded shaft 226 is received in sleeve 220. Motor 232 is secured to lower plate 222, and includes output shaft 234 extending downward through an opening in lower plate 222. Output shaft 234 is connected to threaded shaft 226 by coupling means 236 that may comprise a pair of sprockets and a suitable drive chain. It will therefore be appreciated that operation of motor 232 will cause shaft 226 to rotate, thereby causing elevator 200 to move upward or downward with respect to table 40. The upward or downward movement of elevator 200 in turn results in upward and downward (Z axis) movement of elevator assembly 50, to permit the elevator assembly to access particular wafers and to raise or lower cassettes as previously described.

Figure 13:
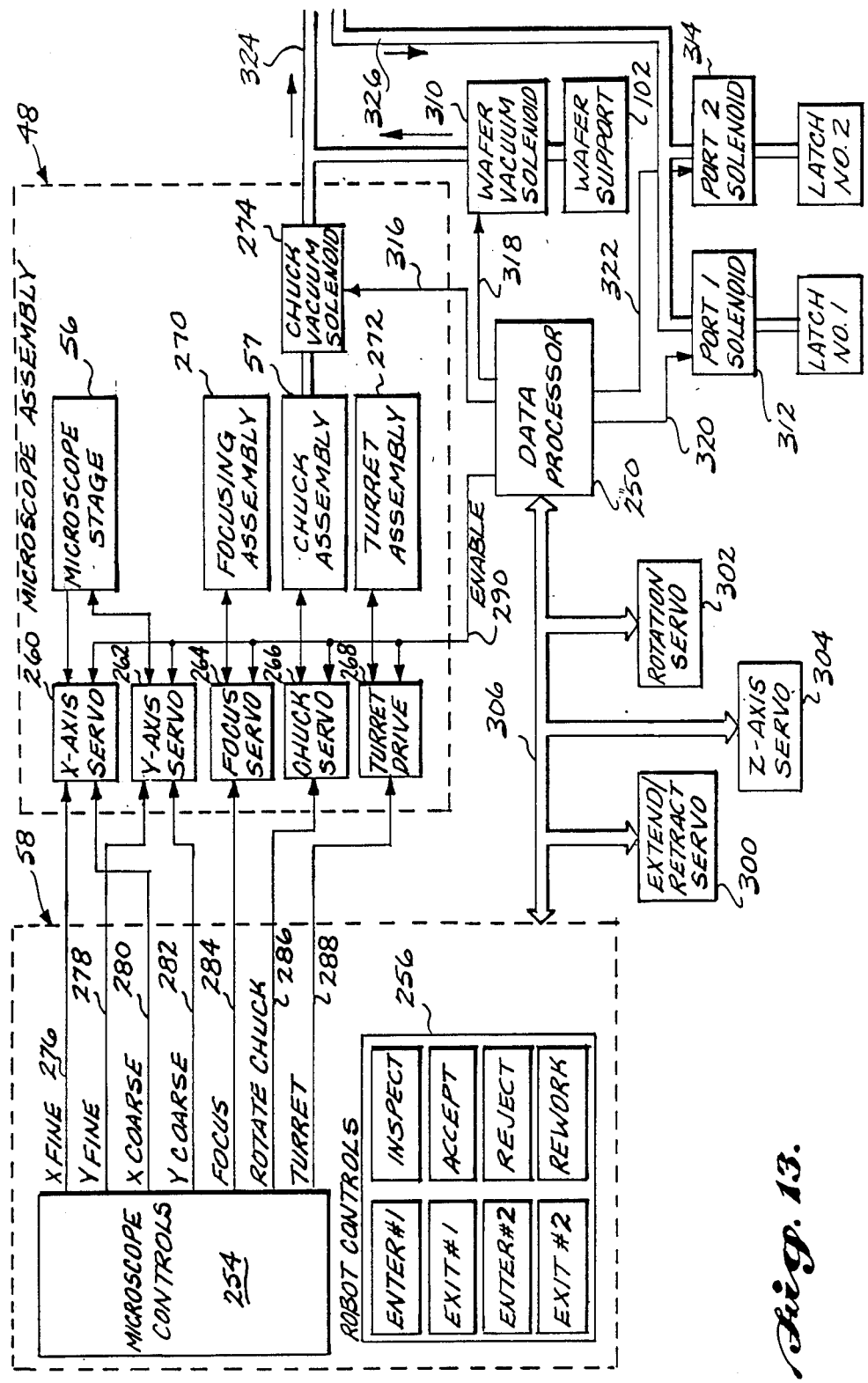
FIG. 13 is a block diagram of the control system of the apparatus.

FIG. 13 presents a block diagram of the wafer handling apparatus of the present invention. The apparatus includes microscope assembly 48 and control panel 58, both previously described in connection with FIGS. 3-5, and data processor 250. Control panel 58 includes microscope controls 254 for controlling the operation of microscope assembly 48, and robot controls 256 for controlling the operation of the robot assembly.

Microscope assembly 48 includes X and Y axis servos 260 and 262 respectively, focus servo 264, chuck servo 266 and turret drive 268. The X and Y axis servos control the X and Y (i.e., horizontal) position of microscope stage 56. Focus servo 264 controls the focusing assembly 270 of the microscope assembly, and chuck servo 266 controls the rotational position of chuck assembly 57. Turret drive 268 controls turret assembly 272, the turret being of conventional construction including 3-5 objectives that can be selected for varying the magnification and field of view.

Each of the servos in microscope assembly 48 preferably receives its input signal via one or more potentiometers of microscope controls 254. The microscope controls preferably include a pair of joysticks for fine and coarse adjustment of the position of the microscope stage. Each joystick is of conventional construction, and includes two potentiometers for sensing X and Y position inputs. The fine adjustment joystick produces output signals on lines 276 and 278, while the coarse adjustment joystick produces output signals on lines 280 and 282. The signals on lines 276 and 280 are both input to X axis servo 260, with different scale factors corresponding to the desired fine and coarse adjustment scales. In a similar manner, the signals on lines 278 and 282 are input to Y axis servo 262. Each servo preferably includes a motor for moving the microscope stage, and both position and velocity feedback elements, to achieve precise movement control. The input to focus servo 262 is preferably provided from a potentiometer of microscope control 254 via a signal on line 284, and the input to chuck servo 266 is similarly provided via a potentiometer and connected to the chuck servo via line 286. The turret signal provided on line 288 may be in any conventional format for causing the turret drive to move turret assembly 272 to a predetermined position, or to cause the turret drive to move the turret assembly a step at a time in either of two rotational directions. As described further below, each of the servos and the turret drive of microscope assembly 48 is controlled by an enable signal on line 290 provided by data processor 250. The enable signal is discussed further below. Once the enable signal is provided, the control of the microscope assembly from microscope controls 254 occurs without intervention of data processor 250.

Robot assembly 50 is controlled by extend/retract servo 300, rotation servo 302, and Z axis servo 304. Each of these robot servo systems is controlled by data processor 250 via bus 306. Extend/retract servo 300 is coupled to post control 206 (FIG. 12), and controls the rotational positions of shafts 104 and 106, to thereby control the extension and retraction of the robot assembly. Rotation servo 302 is coupled to rotator 208, and controls the rotational position of the robot assembly. Z axis servo 304 is coupled to motor 232, and controls the Z axis elevation of the robot assembly.

The pneumatic system of the wafer handling apparatus includes chuck vacuum solenoid 274 of microscope assembly 48, wafer vacuum solenoid 310, port 1 solenoid 312, and port 2 solenoid 314. The chuck and wafer vacuum solenoids are connected to a suitable, externally provided source of negative air pressure by line 324, and the port solenoids are similarly connected to an externally provided source of positive air pressure via line 326. Chuck vacuum solenoid 274 and wafer vacuum solenoid 310 are controlled by data processor 250 via lines 316 and 318, respectively, and port 1 solenoid and port 2 solenoid are similarly controlled by the data processor via lines 320 and 322. In response to an appropriate command from data processor 250 on line 316, chuck vacuum solenoid 274 connects chuck assembly 57 to line 324, therefore providing a chuck vacuum to hold a wafer on the chuck. In a similar manner, in response to a signal on line 318, wafer vacuum solenoid 310 provides a vacuum to wafer support 102, thereby permitting a wafer to be held by the wafer support. The data processor similarly controls port 1 solenoid 312 and port 2 solenoid 314 such that positive air pressure on line 326 can be provided to latch no. 1 and latch no. 2, respectively. Latch no. 1 comprises latch actuators 84 and 86 of first port assembly 42, and latch no. 2 comprises similar latch actuators for second port assembly 44.

Figure 14A:
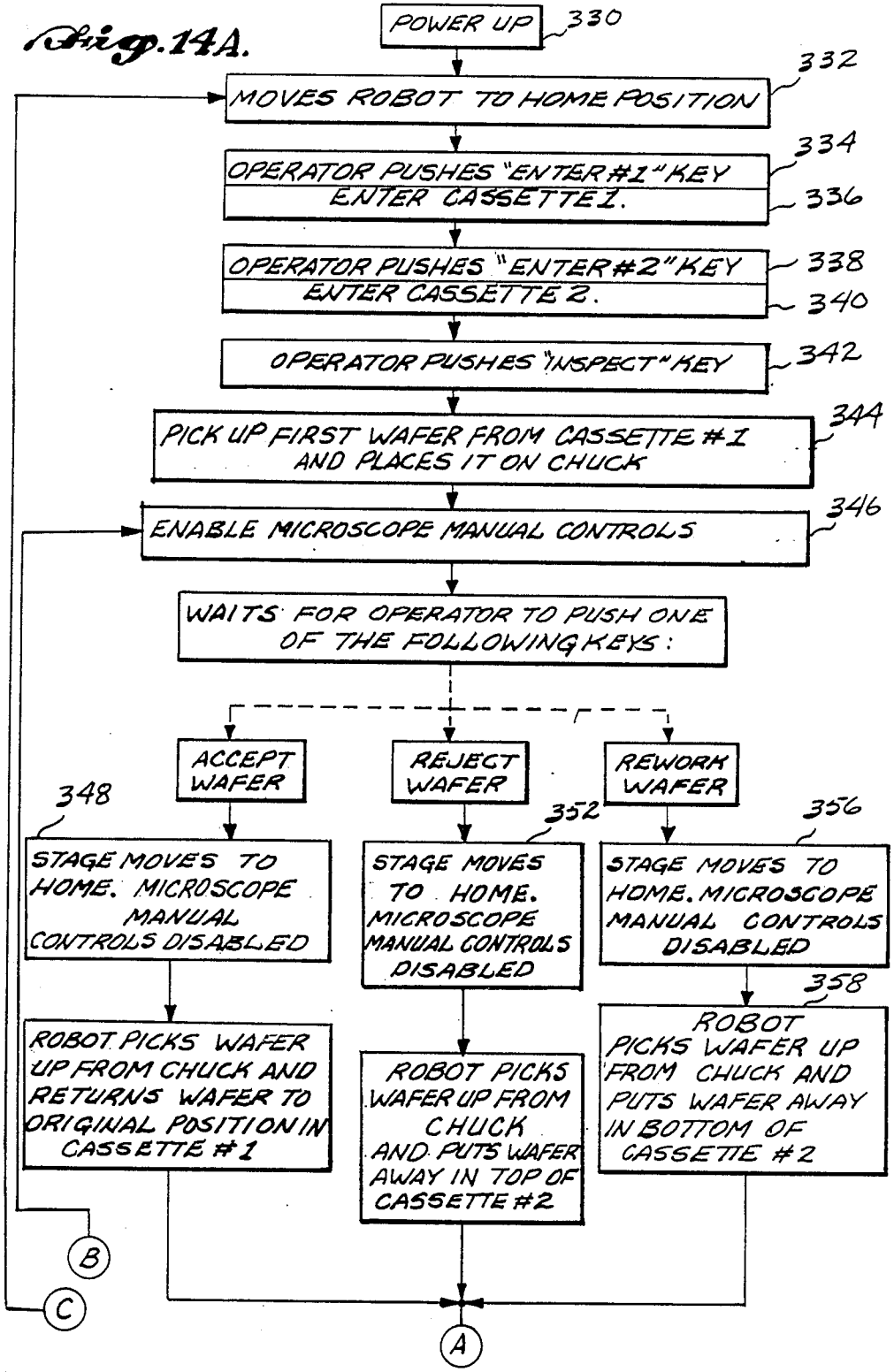
FIGS. 14A and 14B are a flow chart for a typical sequence of operations of the wafer handling apparatus.
Figure 14B:
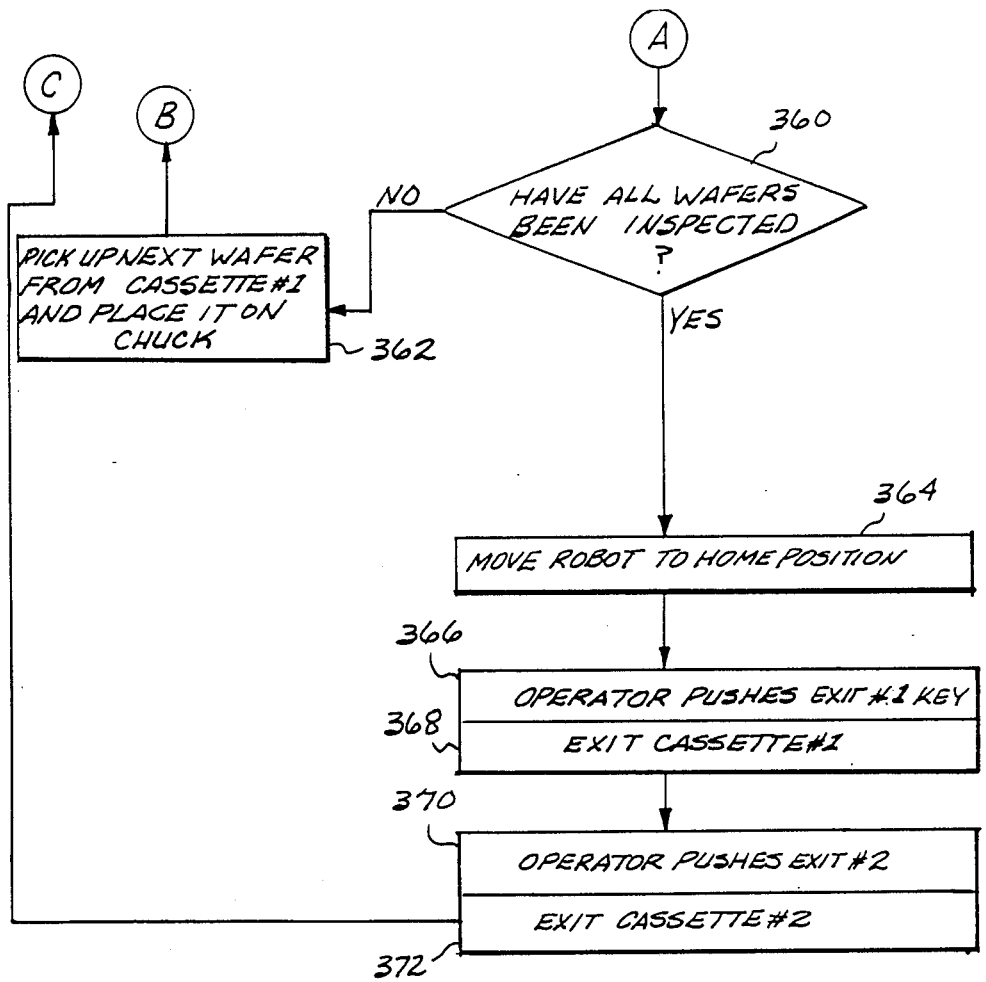

FIGS. 14A and 14B provide an exemplary flow chart for the operations of data processor 250, for a typical wafer handling operation. Operation is commenced upon power up in block 330, whereupon block 332 causes the robot assembly to move to a home position. The home position may be defined in any convenient manner. By way of example, the home position for the robot assembly may comprise a position in which the robot arms are retracted, the robot is fully lowered in the Z direction, and the robot is oriented facing first port assembly 42. Subsequent operations of the wafer handling device will assume a prescribed sequence of keys of robot controls 256 is depressed by an operator. In block 334, it is assumed that the operator places box 10 in first port assembly 42, and then depresses the key labeled ENTER #1 of robot controls 256. Control then passes to block 336, in which the data processor carries out a prescribed series of steps to enter the cassette into the system. By way of example, such steps may comprise the following: rotate robot assembly to face first port assembly 42; extend robot arms; raise robot assembly such that box 100 contacts the underside of plate 74 (FIG. 10); actuate port 1 solenoid thereby operating latch actuators 84 and 86; lower robot assembly, thereby lowering elevator assembly 66 and the cassette positioned thereon to table 40; retract robot assembly. The cassette entered via the first port assembly will hereafter be referred to as cassette no. 1.

In block 338, it is assumed that the operator places box 11 in second port assembly 44, and then depresses the ENTER #2 key of robot controls 256. In response the data processor, in block 340, executes a series of operations essentially identical to those executed in block 336 above, except with respect to the second port assembly. Thus at this point, two cassettes have been introduced into the area enclosed by canopy 252, and the wafers in such cassettes are ready for processing. The cassette entered via the second port assembly will hereafter be referred to as cassette no. 2.

In block 342, it is assumed that the operator depresses the "INSPECT" key of robot controls 256. Control then passes to block 344, wherein the robot picks up the first wafer from cassette no. 1, and places it on the chuck. The sequence of operations in block 344 would typically comprise the following: rotate robot assembly to face first port assembly 42; adjust vertical position of robot assembly to that of the desired wafer; extend robot assembly; raise robot assembly a small prescribed increment to place wafer support 102 immediately adjacent the underside of the wafer edge; actuate wafer vacuum solenoid 310; retract robot assembly; rotate robot assembly towards stage 56; adjust elevation of robot assembly to an appropriate position; extend robot assembly; lower robot assembly such that the wafer is placed on chuck 57; deactivate wafer vacuum solenoid 310; activate chuck vacuum solenoid 274; lower robot assembly by a small predetermined amount to move the wafer support clear of the wafer; retract robot assembly.

Once the steps in block 344 have been completed, control passes to block 346, wherein an enable signal is provided on line 290, thus enabling the microscope controls to permit control of the microscope via control panel 58. The operator may then proceed through any desired series of steps to inspect the wafer. When inspection is complete, the operator presses the ACCEPT key, the REJECT key, or the REWORK key. If the ACCEPT key is pressed, then control passes to block 348, wherein stage 56 is moved to a predefined home position, and the enable signal on line 290 is terminated, thereby disabling the microscope controls. Control then passes to block 350, wherein a series of steps, that is essentially the opposite of those carried out in block 344, is performed. The steps have the effect of returning the wafer to its original position in cassette no. 1. On the other hand if the REJECT key is pressed, then the stage is homed and the microscope controls are disabled in block 352, and block 354 then moves the wafer to a position at the top of cassette no. 2. Finally, if the REWORK key is pressed, then the microscope stage is homed and the microscope controls are disabled in block 356, and the wafer is then returned in block 358 to a position at the bottom of cassette no. 2. In all three cases, control then passes to block 360, which determines whether all the wafers in cassette no. 1 have been processed. If not, then control passes to block 362, wherein a series of steps essentially identical to those in block 344 is carried out, except that the next rather than the first wafer in cassette no. 1 is retrieved and placed on the chuck. The above-described series of operations is then continued until all wafers in cassette no. 1 have been processed. At this time, cassette no. 1 contains all wafers that have been accepted, whereas cassette No. 2 contains rejected wafers in a group at the top of the cassette and wafers that must be reworked in a group at the bottom of the cassette. Block 364 then returns the robot assembly to its home position and the apparatus then awaits further operator input. It is assumed that in block 366 the operator pushes the EXIT #1 key, whereupon control passes to block 368 in which the wafer handling apparatus goes through a series of operations that are essentially the reverse of those carried out in block 336, the result of such operations being that the cassette no. 1 is returned to box 10, the box cover is unlatched from the first port assembly and relatched to the box door, and the port door is relatched to the first port assembly, whereupon the box is disengaged from the first port assembly and ready for removal by an operator. It is assumed in block 370 that the operator then actuates the EXIT #2 key, whereupon similar operations are performed for cassette no. 2 in block 372. The data processor then returns control to block 332, whereupon the robot assembly is moved to its home position, and the data processor then waits in block 334 for another processing sequence to begin.

It is to be understood that the flow chart of FIGS. 14A and 14B is simply one example of the operation of a wafer inspection apparatus. Those skilled in the art will appreciate that additional features could readily be added to such a system, for example the ability to specify the retrieval or replacement of a wafer from a particular shelf of a particular cassette. When the present invention is used in a context other than in an inspection apparatus, the operational sequence would also be modified to suit the particular application. The flow chart of FIGS. 14A and 14B does, however, illustrate and underscore the significant advantages and the versatility provided by the present invention.

While the preferred embodiments of the invention have been illustrated and described, it is to be understood that variations will be apparent to those skilled in the art. The present invention is therefore not to be limited to the specific embodiments described, and the true scope and spirit of the invention is to be determined by reference to the following claims.

The embodiments of the invention in which an exclusive property or privilege is claimed are defined as follows:

1. An apparatus for handling a sensitive material in a self-contained environment, the sensitive material being stored in a box having a cover, a bottom, means for releasably connecting and sealing the cover to the bottom, and a carrier for supporting the sensitive material, the apparatus comprising:

a base;

a canopy attached to the base so as to create an enclosed space therebetween, the canopy including a port door releasably secured to the canopy, the port door including an upper surface adapted for supporting the bottom of the box;

manipulator means comprising a robot assembly for both moving the carrier out of the cover after the box has been positioned on the port door and for transferring the sensitive material between the carrier and another location within the enclosed space; and electronic control means for controlling the manipulator means.

2. The apparatus of claim 1, further comprising a latch actuator secured to the canopy and movable between first and second positions, the latch actuator in its first position being operative to secure the port door to the canopy, movement of the latch actuator from its first position to its second position when the box has been positioned on the port door being operative to release the port door from the canopy, release the bottom from the cover, and secure the cover to the canopy.

3. The apparatus of claim 1, wherein the manipulator means comprises a support, and means for moving the support upward and downward along a vertical Z axis, and wherein the robot assembly is mounted by the support, the robot assembly comprising a tip for engaging the sensitive material, means for retracting and extending the tip along a radial direction respectively towards and away from the Z axis, and means for rotating the tip in a circular direction about the Z axis.

4. The apparatus of claim 1, further comprising a latch actuator operative when the box has been positioned on the port door for releasing the bottom from the cover and releasing the port door from the canopy, and wherein the manipulator means comprises a tip adapted for engaging the sensitive material and the port door, and means for moving the tip such that when the bottom and port door have been released from the cover and canopy respectively, the tip can support and lower the port door, bottom and carrier such that the carrier is moved out of the cover, and such that when the carrier has been moved out of the cover, the sensitive material can be engaged by the tip and moved between the carrier and the other location.

5. The apparatus of claim 4, wherein the manipulator means comprises a support, and means for moving the support upward and downward along a vertical Z axis, and wherein the robot assembly is mounted by the support, the robot assembly comprising the tip, means for retracting and extending the tip along a radial direction respectively towards and away from the Z axis, and means for rotating the tip in a circular direction about the Z axis, such that the tip when extended can be positioned under the port door to suport and lower the port door.

6. The apparatus of claim 5, further comprising a group of two or more vertically oriented posts extending between the base and the canopy, and means for slidably mounting the port door to the posts such that the port door can be moved upward and downward along the posts to and from a raised position in which the port door can be secured to the canopy.

7. The apparatus of claim 1, wherein the canopy includes a second port door, the second port door being releasably secured to the canopy and including an upper surface adapted for supporting the bottom of the box, and wherein the robot assembly is further operable when the box has been positioned on the second port door for moving the carrier out of the cover and for transferring the sensitive material between the carrier and the other location.

8. The apparatus of claim 7, further comprising a latch actuator associated with each port door, each latch actuator being operative when the box has been positioned on the port door for releasing the bottom from the cover and releasing the associated port door from the canopy, and wherein the manipulator means comprises a tip adapted for engaging the sensitive material and the port doors, and means for moving the tip such that when the bottom and either port door have been released from the cover and canopy, respectively, the tip can support and lower the port door, bottom and carrier such that the carrier is moved out of the cover, and such that when the carrier has been moved out of the cover, the sensitive material can be engaged by the tip and moved between the carrier and the other location.

9. The apparatus of claim 8, wherein the manipulator means comprises a support, and means for moving the support upward and downward along a vertical Z axis, and wherein the robot assembly is mounted by the support, the robot assembly comprising the tip, means for retracting and extending the tip along a radial direction respectively toward and away from the Z axis, and means for rotating the tip in a circular direction about the Z axis, such that the tip when extended can be positioned under either port door to support and lower the port door.

10. The apparatus of claim 9, further comprising first and second groups of two or more vertically oriented posts each, each post in the first group extending between the base and the canopy adjacent one port door, and each post in the second group extending between the base and the canopy adjacent the other port door, and means associated with each group for slidably mounting the associated port door to the posts of such group such that the port door can be moved upward and downward along the posts to and from a raised position in which the port door can be secured to the canopy.

11. An apparatus for inspecting a sensitive material in a self-contained environment, the sensitive material being stored in a box having a cover, a bottom, a latch for selectively connecting and sealing the cover to the bottom, and a carrier for supporting the sensitive material, the apparatus comprising:

a base;

a canopy attached to the base so as to create an enclosed space therebetween, the canopy including a port door releasably secured to the canopy, the port door including an upper surface adapted for supporting the bottom of the box;

a microscope assembly supported by the base, the microscope assembly including a viewing stage positioned within the enclosed space;

manipulator means comprising a robot assembly for both moving the carrier out of the cover after the box has been positioned on the port door and for transferring the sensitive material out of the carrier to said stage; and electronic control means for controlling the microscope assembly and the manipulator means.

12. The apparatus of claim 11, further comprising a latch actuator secured to the canopy and movable between first and second positions, the latch actuator in its first position being operative to secure the port door to the canopy, movement of the latch actuator from its first position to its second position when the box has been positioned on the port door being operative to release the port door from the canopy, release the bottom from the cover, and secure the cover to the canopy.

13. The apparatus of claim 11, wherein the manipulator means comprises a support, and means for moving the support upward and downward along a vertical Z axis, and wherein the robot assembly is mounted by the support, the robot assembly comprising a tip for engaging the sensitive material, means for retracting and extending the tip along a radial direction respectively towards and away from the Z axis, and means for rotating the tip in a circular direction about the Z axis.

14. The apparatus of claim 11, further comprising a latch actuator operative when the box has been positioned on the port door for releasing the bottom from the cover and releasing the port door from the canopy, and wherein the manipulator means comprises a tip adapted for engaging the sensitive material and the port door, and means for moving the tip such that when the bottom and port door have been released from the cover and canopy, respectively, the tip can support and lower the port door, bottom and carrier such that the carrier is moved out of the cover, and such that when the carrier has been moved out of the cover, the sensitive material can be engaged by the tip and moved between the carrier and the viewing stage.

15. The apparatus of claim 11, wherein the canopy includes a second port door, the second port door being releasably secured to the canopy, and including an upper surface adapted for supporting the bottom of the box, and wherein the robot assembly is further operable when the box has been positioned on the second port door for both moving the carrier out of the cover and for transferring the sensitive material between the carrier and viewing stage.

* * * * *

UNITED STATES PATENT AND TRADEMARK OFFICE
CERTIFICATE OF CORRECTION

PATENT NO. : 4,746,256
DATED : May 24, 1988
INVENTOR(S) : Edward F. Boyle and G. Scott Wilkins It is certified that error appears in the above-identified patent and that said Letters Patent is hereby corrected as shown below:

```
Column 1, line 8, insert --of-- before "sensitive"

Column 1, line 54, "26" should be --14--

Column 6, line 33, "196" should be --194--

Column 6, line 51, "move" should be --moves--

Column 7, line 4, "14" should be --16--

Column 8, line 46, "262" should be --264--

Column 10, line 28, "thewafer" should be --the wafer--

Column 12, line 27, "suport" should be --support--

Column 13, lines 16 and 17, "11." should be --11.  An--
                                                  An
```

Signed and Sealed this

Twenty-ninth Day of November, 1988

Attest:

DONALD J. QUIGG

Attesting Officer   Commissioner of Patents and Trademarks